United States Patent [19]

Grupen-Shemansky et al.

[11] Patent Number: 5,080,933

[45] Date of Patent: Jan. 14, 1992

[54] SELECTIVE DEPOSITION OF POLYCRYSTALLINE SILICON

[75] Inventors: Melissa E. Grupen-Shemansky, Mesa; Hang M. Liaw, Scottsdale, both of Ariz.

[73] Assignee: Motorola, Inc., Schaumburg, Ill.

[21] Appl. No.: 577,248

[22] Filed: Sep. 4, 1990

[51] Int. Cl.$^5$ .............................................. C23C 16/00
[52] U.S. Cl. ................................. 427/255.1; 427/294; 427/314
[58] Field of Search .................. 427/255, 255.1, 255.7, 427/301, 314, 255.2, 294

*Primary Examiner*—Bernard Pianalto
*Attorney, Agent, or Firm*—Joe E. Barbee

[57] ABSTRACT

A method for selectively depositing polysilicon on a semiconductor surface (13) is accomplished by preparing the surface (13) in a manner to provide a contamination free surface. The contamination free semiconductor surface is placed into a chemical vapor deposition reactor. The semiconductor surface (13) is exposed to a single crystal inhibitor gas to prevent formation of single crystal silicon on surface (13). Semiconductor surface (13) is then exposed to a silicon containing gas with a hydrogen source to form the polysilicon.

21 Claims, 1 Drawing Sheet

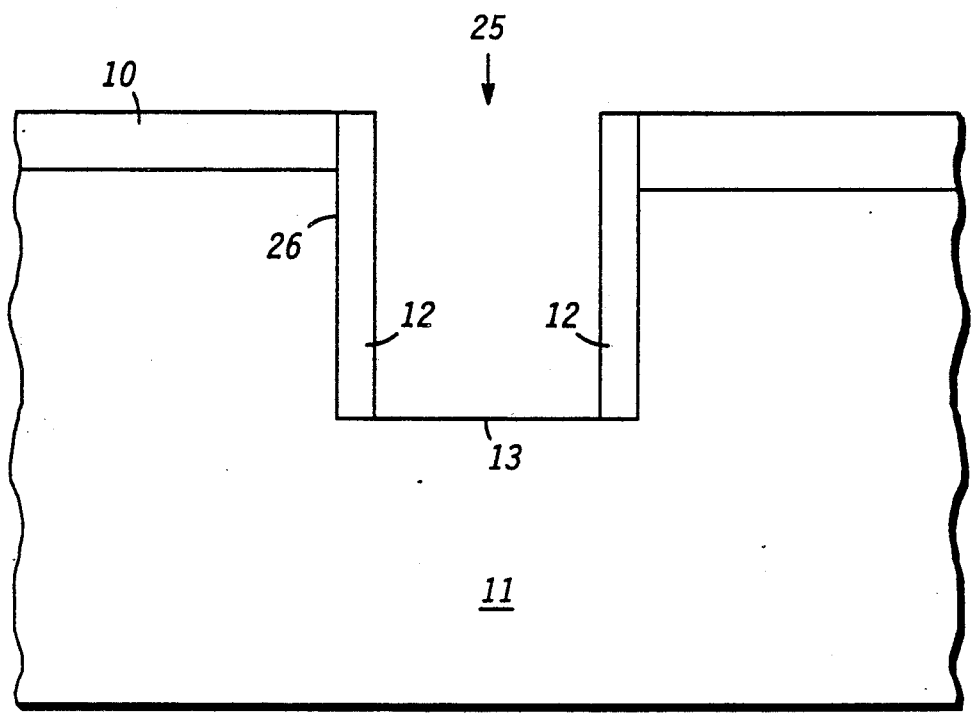

SELECTIVE DEPOSITION OF POLYCRYSTALLINE SILICON

BACKGROUND OF THE INVENTION

This invention relates, in general, to depositing of polysilicon on a semiconductor wafer, and more specifically to selective deposition of polycrystalline silicon, microcrystalline silicon, and amorphous polysilicon.

It has been desired to be able to selectively deposit semiconductor materials on semiconductor wafers, thereby obtaining a self aligning deposition process. This desire has been accentuated as aspect ratios increase and feature size continues to shrink. Aspect ratio is defined as depth divided by width between two adjacent features. By way of example, if the depth between two features such as walls of a trench is held constant and the width or distance between the two features decreases the aspect ratio increases. Standard methods of deposition prove to be insufficient to meet these growing demands. For example, when standard conformal deposition methods are used to fill variable width trenches problems occur depending on the spacing of the trenches. Narrow trenches close and seal long before the wide trenches do. It is therefore necessary to deposit a very thick film in order to fill wide trenches for planarity purposes. Once the deposition is completed and both wide and narrow trenches are filled and sealed an etchback step is required to remove excess material from the surface of the wafer. This leaves material in both wide and narrow trenches yielding a planar surface. This extra processing requires several steps and therefore increases defectivity and cost to a product.

Additionally, it has also been desired to be able to selectively deposit polysilicon or microcrystalline silicon on P/N junction layers to form a part of an active semiconductor device. By way of example is the selective deposition of polysilicon as an emitter of a bipolar transistor.

Recent attempts to obtain selective polysilicon deposition have also had problems. Problems such as loss of selectivity, grain size control, and film contamination are a few problems of major interest.

Loss of selectivity is generally a contamination issue. Contamination causes a loss of selectivity by creating a nucleation site outside of a desired reaction location for growth to occur. Contamination is usually dealt with by rigorous control of all wafer processes and equipment.

Grain size is an important physical parameter of deposition of most films. In the case of selective polysilicon, grain size plays an important part in the future planarity of devices yet to be built. If grain size is large, surface morphology is sharp and angular which requires additional processing steps to planarize the film. These extra processing steps result in additional processing costs as well as higher defectivity. Therefore, there is a need for small grain selective polycrystalline silicon so as to reduce the number of steps to as few as possible.

Film contamination is of great concern in the manufacturing of semiconductor devices. Contamination in films can cause unknown effects that may be hazardous to devices. Work discussed and done by Furumura et. al. "Selective Growth of Polysilicon", Journal Electrochemical Society 133 (1986) pages 379–383, describes a method of obtaining selective growth of polysilicon. This technique introduces trichloroethylene into a gas mixture containing dichlorosilane and hydrogen during epitaxial silicon growth. The contaminating trichloroethylene interrupts the crystal growth pattern and produces polysilicon. This technology is disadvantageous because carbon contamination is found in the bulk of the deposited film. The addition of carbon into the film causes the polysilicon to be more resistive than a non-contaminated film.

It can be seen that standard conformal methods of deposition have severe limitations. Additionally, it is evident that previously disclosed methods for selective deposition of polysilicon also have disadvantages and problems. Therefore, a method for improving selective deposition of polysilicon would be highly desirable.

BRIEF DESCRIPTION OF THE DRAWINGS

A single FIGURE illustrates an example of a portion of a cross-section of a semiconductor wafer prepared for selective deposition of polysilicon.

SUMMARY OF THE INVENTION

The objects and advantages of the present invention are provided by a method for selectively depositing polysilicon on a semiconductor wafer by placing the semiconductor wafer in a chemical vapor deposition reactor. A single crystal growth inhibiting gas is then passed over the wafer. The wafer is then exposed to a silicon containing gas and a hydrogen source.

DETAILED DESCRIPTION OF THE INVENTION

Illustrated in the single drawing is an example of a portion of a cross-sectional view of a semiconductor substrate 11 prepared for selective polysilicon deposition. Substrate 11 in this example is silicon, however, other substrate materials can be used such as germanium, gallium arsenide, or the like. It should be understood though that changing substrate 11 from silicon to some other material may require special processing.

Substrate 11 is provided with an etch mask film 10 which defines the boundaries for etching of trench 25. Trench 25 is etched to a desired depth in substrate 11. Sidewalls 26 are covered by a dielectric or insulator 12. Etching of etch mask 10, trench 25, and formation of sidewall insulation 12 are provided by well known processing techniques in the semiconductor art. It should be understood that providing a clean contamination free surface 13 at the bottom of trench 25 is important to practicing the invention.

By way of example, trench 25 is used to provide a new dielectric isolation technology wherein a selective low temperature polycrystalline silicon growth is used to to fill trench 25. This isolation scheme is used to overcome drawbacks of a standard LOCOS isolation technology for high speed VLSI circuits. By selectively depositing polycrystalline silicon in nitride lined trenches using a silicon tetrachloride and hydrogen system, planar dielectric isolation regions may be created upon subsequent oxidation circumventing lateral oxide encroachment and its associated size reduction limitations.

Exposed surface 13 is placed into a chemical vapor deposition reactor. It should be understood that either a hot or cold walled reactor may be used. Surface 13 has been prepared in a manner to provide a clean contamination free surface. Surface 13 is exposed to a single crystal inhibitor gas which treats clean substrate 13.

Exposure of surface 13 to single crystal inhibitor gas allows for the single crystal inhibitor gas to be adsorbed onto surface 13 forming inhibitor sites. Inhibitor sites occur in an irregular manner which upon subsequent processing interrupts or inhibits single crystal growth thus forming polysilicon instead of single crystal silicon. Single crystal inhibitor gases can be nitrogen, argon, or the like. Treatment of clean substrate surface 13 with the inhibitor gas is accomplished within a temperature range of 600 degrees centigrade to 1000 degrees centigrade with an optimum of 800 degrees centigrade. Subsequently, care must be taken at higher temperatures that adsorbed inhibitor sites are not removed from surface 13, which would then result in an epitaxial like layer being grown, which is not desired. Pressure ranges of single crystal inhibition are from 10 millitorr to atmospheric with an optimum of 740 torr. Using optimum conditions, exposure time that is necessary to treat surface 13 is at least one minute. Grain size of polysilicon is affected by changing exposure times. Short exposure times yields large grain sizes whereas, long exposure times yield small grains. It should be realized that changing reactor temperatures, pressures, time, or the like will affect adsorption of single crystal inhibitor gas onto substrate surface 13.

A preferred method for selectively depositing polysilicon on surface 13 is to first perform a hydrogen prebake to clean surface 13. The hydrogen prebake is a cleaning step that exposes the semiconductor wafer to a hydrogen gas. Optimum prebake temperature is 975 degrees centigrade with a range from 600 degrees centigrade to 1000 degrees centigrade. Pressure ranges from 10 millitorr to atmospheric with an optimum of 50 torr. Since native silicon dioxide begins to form on surface 13 within seconds of exposure to environment it is necessary to remove this oxide to return to a clean baseline surface condition before exposing surface 13 to the single crystal inhibitor gas. Exposure to a hydrogen prebake reduces the native silicon dioxide to silicon, as well as, removing some silicon and other contaminates. Use of the hydrogen prebake to clean surface 13 is also contrary to popular belief. Since it is generally believed that a contaminated surface is preferable to a very clean surface for polysilicon formation. Following hydrogen prebake, surface 13 is exposed to the single crystal inhibitor gas which forms inhibitor sites on surface 13. Use of a hydrogen prebake in conjunction with single crystal inhibitor gas exposure yields a very controlled surface predisposed for selective polysilicon, deposition. It should be understood that extended exposure to a hydrogen prebake can cause an undercut of oxide mask 10. However, it should be appreciated that if a clean surface 13 is received it is not necessary to do a hydrogen prebake prior to exposing surface 13 to the single crystal inhibitor gas.

Polycrystalline silicon, microcrystalline silicon, or amorphous silicon is a film composed of silicon with a very irregular crystal pattern. Size differences in the crystal pattern or grains is associated with different names. Polysilicon having the largest grains and amorphous silicon having no grains at all. Microcrystalline silicon is an intermediate size of grain. It will be understood that when the term polysilicon is used herein it means polycrystalline silicon, microcrystalline silicon, amorphous polysilicon, and amorphous silicon. Polysilicon can be formed by many methods such as sputtering, evaporation, or chemical vapor deposition. Chemical vapor deposition (CVD) however is the most widely used deposition process and offers several advantages for manufacturing blanket films. Generally, polysilicon is deposited by decomposition of silane by the following reaction:

$$SiH_4 + Heat \rightarrow Si + 2H_2$$

It should be understood that this reaction is non-selective and usually creates a blanket film of polysilicon on a wafer surface.

A preferred method for creation of a seed layer of polysilicon on a single crystal inhibitor gas treated surface 13 uses silicon tetrachloride ($SiCl_4$) and hydrogen ($H_2$). In this example, silicon tetrachloride and hydrogen contact surface 13. A chemical reaction takes place at surface 13, in which silicon tetrachloride reacts with hydrogen. The reaction leaves silicon atoms on surface 13 and emits molecules of hydrogen chloride gas. It should be understood that other silicon containing gases could be used such as trichlorosilane ($SiHCl_3$), or dichlorosilane ($SiH_2Cl_2$). When these gases are use it is desirable to add hydrogen to the gas mixture. Additionally, silane ($SiH_4$) and hydrogen chloride gas (HCl) could also be used to add the hydrogen. Hydrogen can originate from several different sources and therefore what is meant by a hydrogen source is the direct addition of hydrogen into the gas mixture, or hydrogen which is removed from the silicon molecules containing hydrogen, or by using HCl, or the like. It should be understood that a combination of hydrogen sources can be used to optimize deposition of selective polysilicon. The reactor temperature is maintained in a range from 500 degrees centigrade to 1000 degrees centigrade with an optimum of 700 degrees centigrade during the polysilicon monolayer deposition. Temperature is a very important parameter. Lower temperatures promote formation of polysilicon growth as opposed to higher temperatures which promote formation or growth of single crystal silicon. Pressure in the reactor ranges from 10 millitorr to atmospheric with an optimum of 740 torr. Exposure time is dependent upon process conditions such as temperature, pressure, or the like. It should be understood that there has to be sufficient time for a monolayer or seed of polysilicon to form. This time should be less than 45 minutes but, is dependent on process parameters such as pressure, temperature, or the like. It is believed by exposing clean surface 13 to single crystal inhibitor gas that the single crystal inhibitor gas is adsorbed onto surface 13 which then inhibits single crystal growth at a molecular level thereby resulting in the growth of polysilicon. Exposure of single crystal inhibitor gas treated substrate 13 is believed to create polysilicon by having adsorbed single crystal inhibitor gas on surface 13 inhibit the growing of single crystal silicon at a molecular level. Additionally, lower temperatures are desired for inhibiting the growth of single crystal silicon. This interruption of single crystal growth yields a polysilicon film. Growth rates of this process step are generally considered slow. It should however be realized that a continuation of this step would yield a selective polysilicon growth if given enough time.

Once a seed layer of polysilicon has been achieved, a rapid deposition rate step is used to grow selective polysilicon to a desired thickness. Optimum temperature for rapidly growing selective polysilicon on top of the monolayer is 845 degrees centigrade with a range between 700 degrees centigrade to 1150 degrees centigrade. Care must be taken when using elevated temperatures so that grain size remains at a desired size. Use of higher temperatures can cause larger grains. This tendency to increase grain size with increased temperature is due to surface atom rearrangement due to kinetic energy. Pressure ranges from 10 millitorr to atmospheric with a optimum pressure of 740 torr is used. A preferred gas combination for the rapid deposition rate step is comprised of dichlorosilane and hydrogen. It should be understood that other silicon containing gases could be used, as well as, alternate hydrogen sources.

Doping of selective polysilicon can be advantageous in certain applications such as vertical and/or horizontal interconnects, or the like. Doping is done by bleeding in a small amount of dopant gases into the selective polysilicon gas mixture. Dopants can be either P or N type so as to select an appropriate electrical activity for the selective polysilicon. Adjusting amounts and kinds of dopant injected into the gas mixture changes conductivity of the resultant selective polysilicon. Dopants that are commonly used are phosphine ($PH_3$), diborane ($B_2H_6$), arsine ($AsH_3$), or the like.

Additionally, it should be understood that this invention can be used for selectively depositing polycrystalline, microcrystalline, and amorphous silicon for forming a part or parts of active devices. By way of example, emitters of bipolar transistors can be fabricated by using this invention. Also, elevated sources and drains, stacked capacitors, polysilicon gates of MOS transistors, or the like can be processed by using this invention.

By now it should be appreciated that there has been provided an improved method for depositing selective polysilicon which is very useful in large aspect ratio isolation trenches. The selectivity of polysilicon deposition is achieved by properly preparing the desired or selected surface.

We claim:

1. A method for selectively producing polysilicon on a semiconductor wafer comprising:
   placing a semiconductor wafer into a chemical vapor deposition reactor;
   exposing the semiconductor wafer to a single crystal growth inhibiting gas to inhibit single crystal growth;
   exposing the semiconductor wafer to a silicon containing gas and a hydrogen source, thereby producing the polysilicon.

2. The method of claim 1 further including using nitrogen for single crystal growth inhibiting gas.

3. The method of claim 1 further including maintaining the reactor temperature in a range of approximately 600 to 1000 degrees centigrade for the single crystal growth inhibiting gas and in a range of approximately 500 to 1000 degrees centigrade for the silicon containing gas and hydrogen source.

4. The method of claim 3 further including maintaining the reactor pressure in a range of approximately 10 millitorr to atmospheric for the single crystal growth inhibiting gas and in a range of approximately 10 millitorr to atmospheric for the silicon containing gas and hydrogen source.

5. The method of claim 4 further including adjusting the chemical vapor deposition reactor pressure to substantially 740 torr for the single crystal growth inhibiting gas and to substantially 740 torr for the silicon containing gas and hydrogen source.

6. The method of claim 3 further including adjusting the chemical vapor deposition reactor temperature to substantially 800 degrees centigrade for the single crystal growth inhibiting gas and to substantially 700 degrees centigrade for the silicon containing gas and hydrogen source.

7. The method of claim 1 further including providing the silicon containing gas is one gas from a group comprising silicon tetrachloride, trichlorosilane, dichlorosilane, chlorosilane, and silane.

8. A method for selectively depositing polysilicon on a semiconductor wafer comprising:
   placing the semiconductor wafer into a chemical vapor deposition reactor;
   exposing the semiconductor wafer to a hydrogen environment;
   exposing the semiconductor wafer to a single crystal growth inhibiting gas to inhibit single crystal growth;
   subjecting the semiconductor wafer to a silicon containing gas and hydrogen, thereby selectively depositing polysilicon.

9. The method of claim 8 further including selecting a silicon containing gas from a group comprising silicon tetrachloride, trichlorosilane, dichlorosilane, chlorosilane, and silane.

10. The method of claim 8 further including maintaining the reactor temperature in a range of approximately 600 to 1000 degrees centigrade for exposing the semiconductor wafer to hydrogen, in a range of the approximately 600 to 1000 degrees centigrade for the single crystal growth inhibiting gas, and in a range of approximately 500 to 1000 degrees centigrade for exposing a semiconductor wafer to a silicon containing gas and hydrogen.

11. The method of claim 10 further including maintaining the chemical vapor deposition reactor pressure at a range of 10 millitorr to atmospheric.

12. The method of claim 10 further including adjusting the chemical vapor deposition reactor pressure to substantially 50 torr for exposing the semiconductor wafer to hydrogen, to substantially 740 torr for the single crystal growth inhibiting gas, and to substantially 740 torr for exposing the semiconductor wafer to the silicon containing gas and hydrogen.

13. The method of claim 10 further including a high growth rate sequence for selectively depositing polysilicon.

14. The method of claim 13 further including maintaining the chemical vapor deposition reactor in a temperature range of approximately 600 to 1150 degrees centigrade.

15. The method of claim 8 further including adjusting the chemical vapor deposition reactor temperature to substantially 975 degrees centigrade for exposing the semiconductor wafer to hydrogen, to substantiality 800 degrees centigrade for the single crystal growth inhibiting gas, and to substantially 700 degrees centigrade for exposing a semiconductor wafer to a silicon containing gas and hydrogen.

16. A method for selectively depositing polycrystalline silicon comprising the steps of:
   placing a semiconductor wafer to a hydrogen environment for a prebake treatment;
   exposing the semiconductor wafer into a single crystal growth inhibitor gas to inhibit single crystal growth;

exposing the semiconductor wafer to a silicon containing gas and a hydrogen gas source while maintaining the chemical vapor deposition reactor pressure in a range of 10 millitorr to atmospheric and temperature in a range of 500 degrees centigrade to 1000 degrees centigrade for the formation of at least a monolayer of selective polysilicon; and changing the reactor pressure to a range of 10 millitorr to atmospheric and changing the temperature to a range of 700 degrees centigrade to 1150 degrees centigrade while maintaining the exposure to the silicon containing gas and the hydrogen gas source thereby providing for rapid growth of selective polysilicon on the monolayer.

17. The method of claim 16 further including adjusting the chemical vapor deposition reactor temperature to substantially 975 degrees centigrade for the hydrogen prebake treatment, changing the reactor temperature to substantially 800 degrees centigrade for the single crystal inhibitor gas, changing the reactor temperature to substantially 700 degrees centigrade for the formation of the selective polysilicon monolayer, and changing the temperature to substantially 845 degrees centigrade for the rapid growth of selective polysilicon.

18. The method of claim 16 further including maintaining the chemical vapor deposition reactor pressure to substantially 50 torr for the prebake treatment, changing the reactor pressure to substantially 740 torr for the single crystal inhibitor gas, changing the reactor pressure to substantiality 740 torr for the formation of the selective polysilicon monolayer, and changing the reactor pressure to substantially 740 torr for the rapid growth of selective polysilicon.

19. A method for selectively depositing doped polysilicon on a semiconductor wafer comprising:
   placing the semiconductor wafer into a chemical vapor deposition reactor;
   exposing the semiconductor wafer to a single crystal growth inhibitor gas to inhibit single crystal growth;
   exposing the semiconductor wafer to a silicon gas, hydrogen gas source and dopant source, thereby creating polysilicon.

20. The method of claim 19 further including providing the dopant gas from a group comprising arsine, phosphine, and diborane.

21. The method of claim 20 further including cleaning the semiconductor wafer by a hydrogen prebake prior to exposing the wafer to the single crystal inhibitor gas.

* * * * *